United States Patent [19]
Haslam et al.

[11] Patent Number: 5,321,211
[45] Date of Patent: Jun. 14, 1994

[54] INTEGRATED CIRCUIT VIA STRUCTURE

[75] Inventors: Michael E. Haslam, Highland Village; Charles R. Spinner, III, Dallas, both of Tex.

[73] Assignee: SGS-Thomson Microelectronics, Inc., Carrollton, Tex.

[21] Appl. No.: 876,962

[22] Filed: Apr. 30, 1992

[51] Int. Cl.$^5$ .............................................. H05K 1/00
[52] U.S. Cl. .................................... 174/262; 174/255; 174/257; 174/258
[58] Field of Search ............... 174/262, 255, 257, 258, 174/263, 265

[56] References Cited

U.S. PATENT DOCUMENTS 4,962,414 10/1990 Liou et al. .
5,067,002 11/1991 Zdebel et al. .
5,117,273 5/1992 Stark et al. .

*Primary Examiner*—Leo P. Picard
*Assistant Examiner*—Cheryl R. Figlin
*Attorney, Agent, or Firm*—Kenneth C. Hill; Robert Groover; Richard K. Robinson

[57] ABSTRACT

A structure and method for forming contact vias in integrated circuits. An interconnect layer is formed on an underlying layer in an integrated circuit. A buffer region is then formed adjacent to the interconnect layer, followed by forming an insulating layer over the integrated circuit. Preferably, the insulating layer is made of a material which is selectively etchable over the material in the buffer region. A contact via is then formed through the insulating layer to expose a portion of the interconnect layer. During formation of the contact via, the buffer region acts as an etch stop and protects the underlying layer. The buffer region also ensures a reliable contact will be made in the event of an error in contact via placement.

40 Claims, 2 Drawing Sheets

INTEGRATED CIRCUIT VIA STRUCTURE

BACKGROUND OF THE INVENTION

1. Field of the Invention

The present invention relates generally to the fabrication of semiconductor integrated circuits, and more particularly to a structure and method for forming contact vias in semiconductor integrated circuits.

2. Description of the Prior Art

Conductive interconnect layers typically have an enlarged area in the layer itself at a location where a contact is to be made from a later formed interconnect layer. Those skilled in the art commonly call the enlarged area the enclosure. Recognizing that errors in mask alignment can shift a contact from a desired location, the enclosure accounts for errors in mask alignment by providing additional contact space. Thus, the enclosure ensures a contact will be made to an underlying interconnect layer.

A conflict arises, however, between the need for enclosures and the desire to reduce the chip sizes in integrated circuits. Those skilled in the art will recognize that there must be a minimum amount of space between adjacent conductive elements. Enclosures in an interconnect layer forces the distance between adjacent conductive elements to increase in order to maintain the minimum distance between the adjacent conductive elements. Thus, the need for enclosures places restrictions on how small the size of an integrated circuit can be.

Errors in mask alignment can also cause problems during formation of contact vias. Some contact vias are formed directly above an underlying conductive interconnect layer, and ideally, the contact lies on or touches only the underlying conductive interconnect layer. Errors in mask alignment, however, allow for placement of the contact via to shift from the desired location. And, because formation of contact vias typically requires overetching an insulating layer to ensure all material is removed from the contact via, underlying layers may be damaged during formation of the contact via.

Furthermore, this overetching combined with an error in mask alignment may create small geometric spaces between the conductive interconnect layer and the insulating layer. Those skilled in the art will recognize that it is sometimes difficult to fill in those small geometric spaces. This may cause voids or other defects within the contact, thereby affecting the integrity of the contact and the reliability of the integrated circuit.

Therefore, it would be desirable to provide a method for forming contact vias which protects underlying layers from damage during formation of the contact vias. It is also desirable that such a method form contacts which are free from voids or other defects. Finally, it is desirable that such a method eliminate the need for enclosures in conductive interconnect layers.

SUMMARY OF THE INVENTION

A structure and method is provided for forming contact vias in integrated circuits. An interconnect layer is formed on an underlying layer in an integrated circuit. A buffer region is then formed adjacent to the interconnect layer, followed by forming an insulating layer over the integrated circuit. Preferably, the insulating layer is made of a material which is selectively etchable over the material in the buffer region. A contact via is then formed through the insulating layer to expose a portion of the interconnect layer. During formation of the contact via, the buffer region acts as an etch stop and protects the underlying layer. The buffer region also ensures a reliable contact will be made in the event of an error in contact via placement.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing crosssections of portions of an integrated circuit during fabrication are not drawn to scale, but instead are drawn so as to illustrate the important features of the invention.

Figure 1:
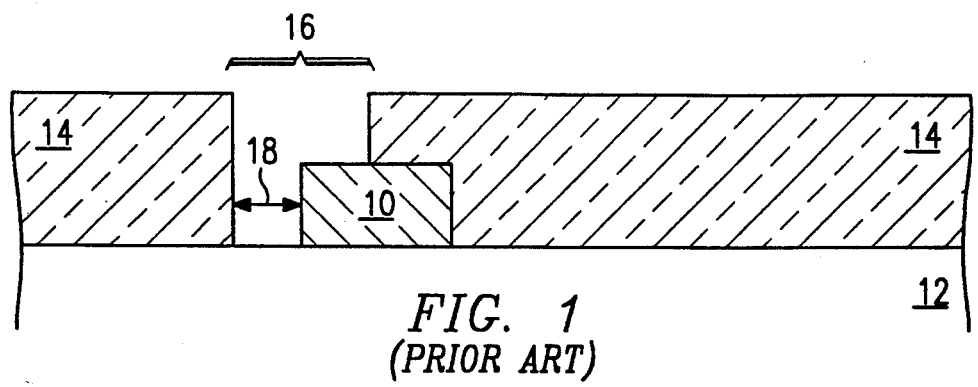
FIG. 1 is a sectional view of an integrated circuit illustrating a prior art structure and method for forming contact vias in integrated circuits.

FIG. 1 is a sectional view of an integrated circuit illustrating a prior art structure and method for forming contact vias in integrated circuits. Referring to FIG. 1, an interconnect layer 10 is formed on an underlying layer 12 in an integrated circuit. The interconnect layer 10 may be made of, for example, metal or polycrystalline silicon. The underlying layer 12 may be either a semiconductor substrate or an interlevel dielectric layer. An insulating layer 14 is then deposited over the integrated circuit, and a contact via 16 is formed through the insulating layer 14 to expose a portion of the interconnect layer 10. Contact via 16 can be formed by either anisotropically etching the insulating layer 14, or by performing an etch which is a combination of an isotropic etch followed by an anisotropic etch.

Those skilled in the art will recognize that it is common to overetch the contact via 16 to ensure that all of the insulating material is removed from the contact via 16. An error in mask alignment, combined with overetching the contact via 16, may cause a space 18 to form between the interconnect layer 10 and the insulating layer 14. Filling in the space 18 during formation of a contact may be difficult due to its small geometric size, resulting in voids or other defects within the contact. Also, the anisotropic etch used to form the contact via 16 may damage the underlying layer 12 exposed in the space 18 during formation of the contact via 16.

Figure 2:
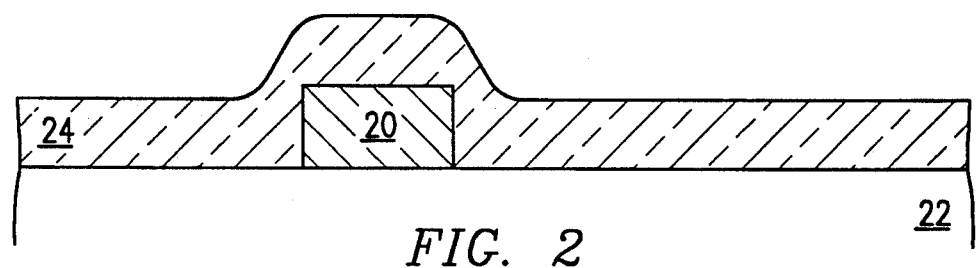
FIGS. 2-4 are sectional views of an integrated circuit illustrating a preferred structure and method for forming contact vias in integrated circuits.
Figure 3:
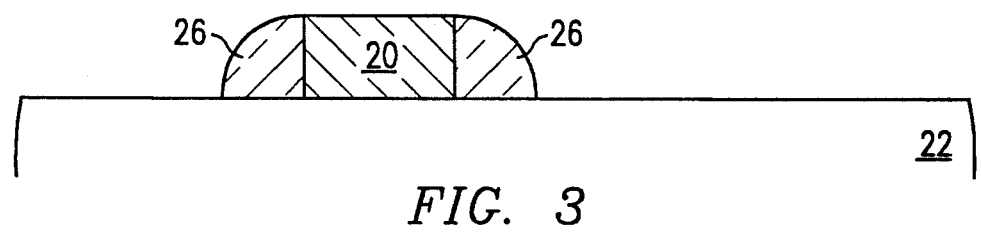
Figure 4:
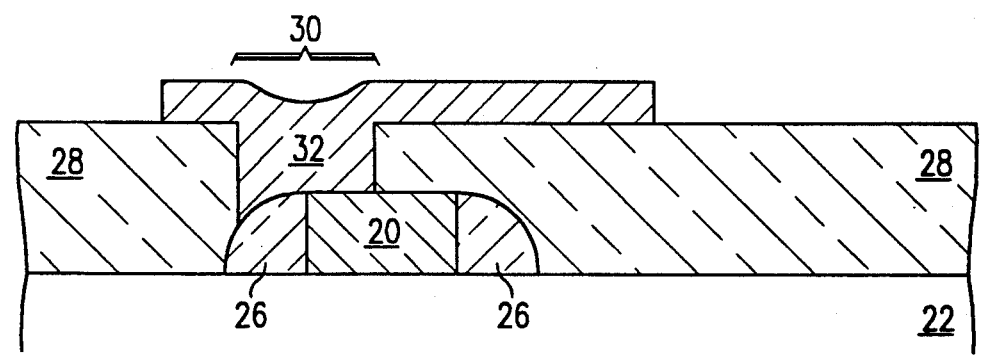

FIGS. 2–4 are sectional views of an integrated circuit illustrating a preferred structure and method for forming contact vias in integrated circuits. Referring to FIG. 2, an interconnect layer 20 is formed on an underlying layer 22 in an integrated circuit. The interconnect layer 22 may be made of metal, polycrystalline silicon, or other conductive materials such as titanium or titanium nitride. The underlying layer 22 may be a semiconductor substrate or an interlevel dielectric layer. A buffer layer 24 is then deposited over the integrated circuit. As discussed in greater detail below, the buffer layer 24 is preferably made of a material which can act as an etch stop when a contact via is formed in a later processing step.

FIG. 3 illustrates the integrated circuit after the buffer layer 24 is anisotropically etched to form sidewall spacers 26 alongside the vertical sidewalls of the interconnect layer 20.

Referring to FIG. 4, an insulating layer 28 is then deposited over the integrated circuit. The material in the insulating layer 28 is preferably a material that is selectively etchable over the material in the sidewall spacers 26. An anisotropic etch is then performed to form a contact via 30 through the insulating layer 28 to expose a portion of the interconnect layer 20. During formation of the contact via 30, the sidewall spacers 26 act as an etch stop and protect the underlying layer 22 from damage. The sidewall spacers 26 also prohibit the formation of a space alongside the interconnect layer 20 when there is an error in mask alignment.

Sidewall spacers 26 may be formed from a variety of materials. The sidewall spacers may be made of nitride. Alternatively, the sidewall spacers 26 may be made of oxide with a nitride layer over the surface of the oxide sidewall spacers. The sidewall spacers 26 may be made of a conductive material, such as polycrystalline silicon or metal. This would have the effect of increasing the upper surface of the interconnect layer 20 by allowing the contact to lie completely on a conductive surface. Alternatively, the sidewall spacers 26 may be made of an insulating material, such as oxide, and have a conductive layer, such as titanium nitride, lying over the surface of the insulating material. Again, this would have the effect of increasing the upper surface of the interconnect layer 20 by allowing the contact to lie completely on a conductive surface.

A conductive layer 32 is then deposited and patterned over a portion of the insulating layer 28 and extends into the contact via 30 to make electrical contact with the interconnect layer 20. Those skilled in the art will recognize that so long as the conductive layer 32 makes contact with a portion of the interconnect layer 20 a reliable contact is made. And, if the sidewall spacers 26 or the upper surface of the sidewall spacers 26 is made of a conductive material, the conductive layer 32 will lie completely on a conductive contact. It is not critical, however, that the conductive layer 32 lie on a portion of the sidewall spacers 26 exposed in the contact via 30. If there is no mask registration error, the conductive layer 32 may lie completely on the upper surface of the interconnect layer 20.

Figure 5:
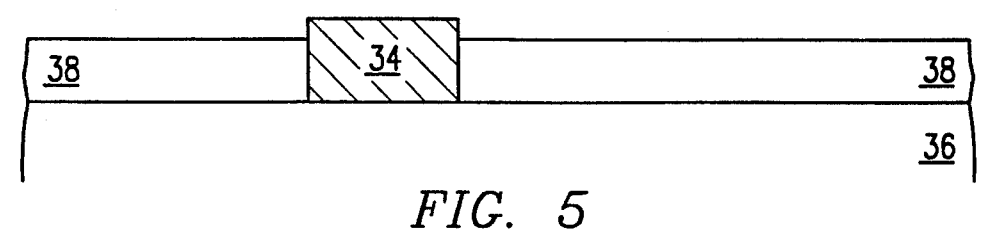
FIGS. 5-9 are sectional views of an integrated circuit illustrating an alternative preferred structure and method for forming contact vias in integrated circuits.

FIGS. 5–9 are sectional views of an integrated circuit illustrating an alternative preferred structure and method for forming contact vias in integrated circuits. Referring to FIG. 5, an interconnect layer 34 is formed on an underlying layer 36 in an integrated circuit. The interconnect layer 34 may be made of metal, polycrystalline silicon, or other conductive materials such as titanium or titanium nitride. The underlying layer 36 may be a semiconductor substrate or an interlevel dielectric layer. A planarizing layer 38 is then formed over the integrated circuit, and anisotropically etched back such that a portion of the interconnect layer 34 is exposed.

Figure 6:
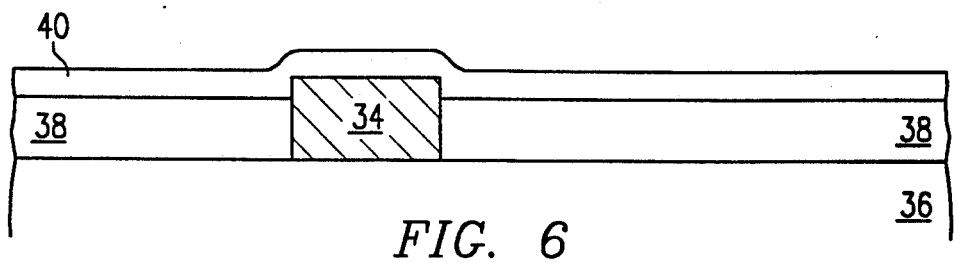

FIG. 6 illustrates the integrated circuit after a first barrier layer 40 is deposited over the integrated circuit. The first barrier layer 40 is preferably made of an insulating material which can act as an etch stop when a contact via is formed in a later processing step.

Figure 7:
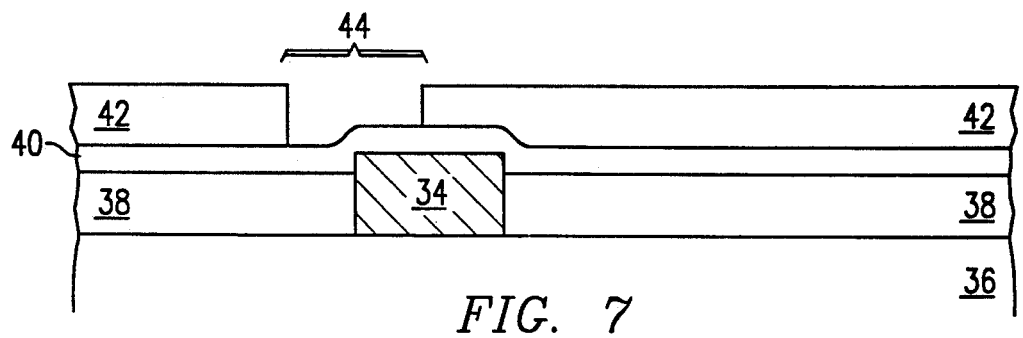

Referring to FIG. 7, an insulating layer 42 is formed over the integrated circuit, and a contact via 44 is formed. Typically, the contact via 44 is created by anisotropically etching the insulating layer 42. The first barrier layer 40 is preferably made of an insulating material which can act as an etch stop for the material in the insulating layer 42. For example, the first barrier layer 40 may be made of nitride or polycrystalline silicon, and the insulating layer may be made of oxide.

Therefore, during formation of the contact via 44, the first barrier layer 40 acts as an etch stop and protects the planarizing layer 38 and the underlying layer 36 from damage. The first barrier layer 40 also prevents the formation of a space between the planarizing layer 38 and the interconnect layer 34.

Figure 8:
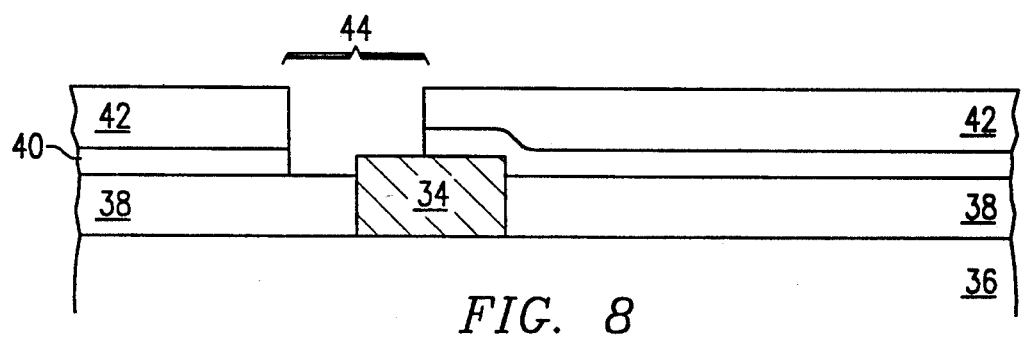

FIG. 8 illustrates the integrated circuit after an etch is performed to remove the portion of the first barrier layer 40 exposed in the contact via 44. Either an isotropic or anisotropic etch may be used to remove the portion of the first barrier layer 40 exposed in the contact via 44.

Figure 9:
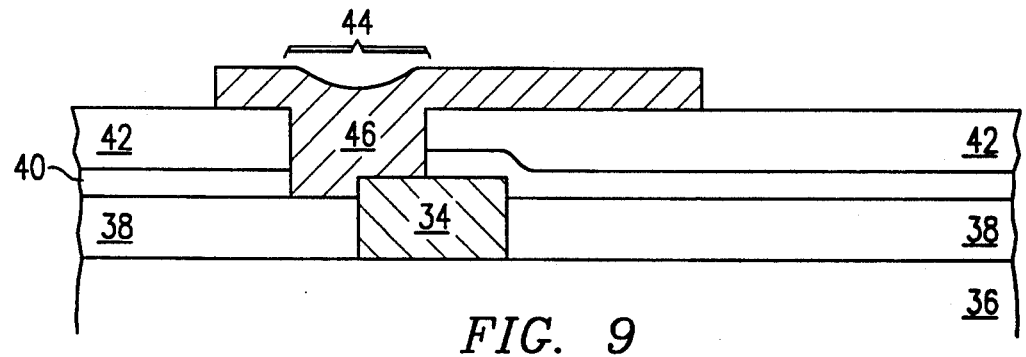

Referring to FIG. 9, a conductive layer 46 is deposited and patterned over a portion of the insulating layer 42 and extends into the contact via 44 to make electrical contact with the interconnect layer 34. Those skilled in the art will recognize that so long as the conductive layer 46 makes contact with a portion of the interconnect layer 34 a reliable contact is made. It is not critical, however, that the conductive layer 46 lie on a portion of the planarizing layer 38 exposed in the contact via 44. If there is no mask registration error, the conductive layer 46 may lie completely on the upper surface of the interconnect layer 34.

Figure 10:
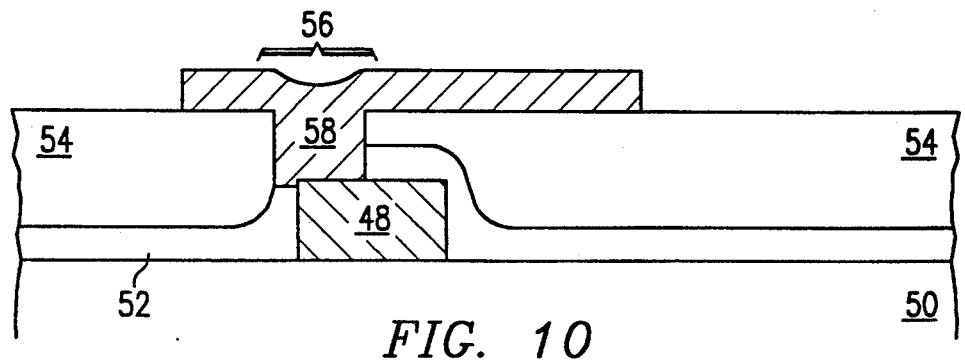
FIG. 10 is a sectional view of an integrated circuit illustrating another alternative preferred structure and method for forming contact vias in integrated circuits.

FIG. 10 is a sectional view of an integrated circuit illustrating another alternative preferred structure and method for forming contact vias in integrated circuits. An interconnect layer 48 is formed on an underlying layer 50 in an integrated circuit. The interconnect layer 48 may be made of metal or polycrystalline silicon, and the underlying layer 50 may be a semiconductor substrate or an interlevel dielectric layer.

A barrier layer 52 is then formed over the integrated circuit, followed by an insulating layer 54. The barrier layer 52 is preferably made of a material which can act as an etch stop for the material in the insulating layer 54. For example, the barrier layer 52 may be made of nitride, and the insulating layer 54 may be made of oxide. A contact via 56 is then formed, first by anisotropically etching the insulating layer 54, and then by etching the portion of the barrier layer 52 exposed by the anisotropic etch. Finally, a conductive layer 58 is deposited and patterned over a portion of the insulating layer 54 and extends into the contact via 56 to make electrical contact with the interconnect layer 48. Those skilled in the art will recognize that so long as the conductive layer 58 makes contact with a portion of the interconnect layer 48 a reliable contact is made. It is not critical, however, that the conductive layer 58 lie on a portion of the second barrier layer 52 exposed in the contact via 56. If there is no mask registration error, the conductive layer 58 may lie completely on the upper surface of the interconnect layer 48.

The methods described above provide alternative methods for forming contact vias in integrated circuits which do not cause damage to underlying layers. The alternative methods also prevent the formation of spaces between an interconnect layer and a surrounding insulating layer, thereby eliminating voids or other defects which may form in the contact. Finally, the methods eliminate the need for enclosures in conductive interconnect layers by ensuring a contact is made between interconnect layers.

While the invention has been particularly shown and described with reference to a preferred embodiment, it will be understood by those skilled in the art that various changes in form and detail may be made therein without departing from the spirit and scope of the invention.

What is claimed is:

1. A contact via in an integrated circuit, comprising:
an interconnect layer over portions of an underlying layer in the integrated circuit;
a buffer region adjacent to the interconnect layer;
an insulating layer overlying the integrated circuit, wherein the insulating layer is made of a material which is selectively etchable over the material in the buffer region;
a contact via through the insulating layer to expose a portion of the interconnect layer; and
a conductive layer overlying portions of the insulating layer and extending into the contact via to make electrical contact with the interconnect layer.

2. The contact via of claim 1, wherein said underlying layer comprises a semiconductor substrate.

3. The contact via of claim 1, wherein said underlying layer comprises an interlevel dielectric layer.

4. The contact via of claim 1, wherein said interconnect layer is made of a metal.

5. The contact via of claim 1, wherein said interconnect layer is made of polycrystalline silicon.

6. The contact via of claim 1, wherein said buffer region comprises sidewall spacers formed alongside the sidewalls of the interconnect layer.

7. The contact via of claim 6, wherein said sidewall spacers are made of a conductive material.

8. The contact via of claim 7, wherein said sidewall spacers are made of metal.

9. The contact via of claim 6, wherein said sidewall spacers are made of an insulating material.

10. The contact via of claim 6, wherein said sidewall spacers are silicided.

11. The contact via of claim 6, wherein said insulating layer comprises oxide.

12. The contact via of claim 6, wherein said conductive layer covers a portion of the buffer region exposed in the contact via.

13. The contact via of claim 1, wherein said buffer region comprises:
a planarizing layer alongside, but not overlying, said interconnect layer; and
a first barrier layer overlying said planarizing layer and said interconnect layer, wherein the contact via is formed through said first barrier layer to expose a portion of said interconnect layer.

14. The contact via of claim 13, wherein said planarizing layer is made of oxide.

15. The contact via of claim 13, wherein said first barrier layer acts as an etch stop and protects the planarizing layer during formation of the contact via.

16. The contact via of claim 13, wherein said first barrier layer is made of nitride.

17. The contact via of claim 11, wherein said buffer region comprises a barrier layer overlying portions of the integrated circuit adjacent to the contact via.

18. The contact via of claim 17, wherein said barrier layer is made of nitride.

19. An integrated circuit via structure, comprising:
a first patterned thin-film conductive layer having substantially vertical sidewalls;
sidewall spacers on said sidewalls of said first layer;
an interlevel dielectric generally overlying said first patterned thin-film conductive layer, and having at least one via opening therein extending down to said first layer, and being made of a material which is selectively etchable with respect to said sidewall spacers; and
a second patterned thin-film conductive layer generally overlaying said interlevel dielectric, and extending down through said via opening to contact said first conductive layer.

20. The integrated circuit of claim 19, wherein said first conductive layer consists of polysilicon.

21. The integrated circuit of claim 19, wherein said sidewall spacers are conductive.

22. The integrated circuit of claim 19, wherein said sidewall spacers consist of metal.

23. The integrated circuit of claim 19, wherein said sidewall spacers consist of polysilicon.

24. The integrated circuit of claim 19, wherein said sidewall spacers consist of silicone dioxide.

25. The integrated circuit of claim 19, wherein said sidewall spacers comprise silicone nitride.

26. The integrated circuit of claim 19, wherein said sidewall spacers comprise a composite structure including silicone nitride overlaid on silicone dioxide.

27. The integrated circuit of claim 19, wherein said sidewall spacers comprise a conductive material overlaid on a nonconductive material.

28. The integrated circuit of claim 19, wherein said first conductive layer comprises polysilicon, and said second conductive layer consists essentially of a metal.

29. The integrated circuit of claim 19, wherein said first and second conductive layers each consist essentially of a metal.

30. An integrated circuit via structure, comprising:
a first patterned thin-film conductive layer overlying at lest one lower layer;
a planarizing layer overlying said lower layer, and being laterally adjacent to but not overlying said first layer; and
an insulating barrier layer overlying said first layer and said planarizing layer;
an interlevel dielectric generally overlying said barrier layer and said patterned thin-film conductive layer, and having at least one via opening therein extending through said barrier layer down to said first layer, and being made of a material which is selectively etchable with respect to said barrier layer; and a second patterned thin-film conductive layer generally overlying said interlevel dielectric, and extending down through said via opening to contact said first conductive layer.

31. The integrated circuit of claim 30, wherein said first conductive layer consists of polysilicon.

32. The integrated circuit of claim 30, wherein said barrier layer consists of polysilicon.

33. The integrated circuit of claim 30, wherein said barrier layer consists of silicon nitride.

34. The integrated circuit of claim 30, wherein said first conductive layer comprises polysilicon, and said second conductive layer consists essentially of a metal.

35. The integrated circuit of claim 30, wherein said first and second conductive layers each consists essentially of a metal.

36. An integrated circuit via structure, comprising:
a first patterned thin-film conductive layer overlying at least one lower layer;
an insulating barrier layer overlying said first layer and said lower layer;
an interlevel dielectric generally overlying said barrier layer and said patterned thin-film conductive layer, and having at least one via opening therein extending through said barrier layer down to said first layer, and being made of a material which is selectively etchable with respect to said barrier layer; and
a second patterned thin-film conductive layer generally overlying said interlevel dielectric, and extending down through said via opening to contact said first conductive layer.

37. The integrated circuit of claim 36, wherein said first conductive layer comprises polysilicon.

38. The integrated circuit of claim 36, wherein said barrier layer consists of silicone nitride.

39. The integrated circuit of claim 36, wherein said first conductive layer comprises polysilicon, and said second conductive layer consists essentially of a metal.

40. The integrated circuit of claim 36, wherein said first and second conductive layers each consists essentially of a metal.

* * * * *